United States Patent
Nemecek

(10) Patent No.: US 8,112,267 B2
(45) Date of Patent: *Feb. 7, 2012

(54) SYSTEM AND A METHOD FOR CHECKING LOCK-STEP CONSISTENCY BETWEEN AN IN CIRCUIT EMULATION AND A MICROCONTROLLER

(75) Inventor: Craig Nemecek, Seattle, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 267 days.

This patent is subject to a terminal disclaimer.

(21) Appl. No.: 12/136,557

(22) Filed: Jun. 10, 2008

(65) Prior Publication Data
US 2008/0243471 A1 Oct. 2, 2008

Related U.S. Application Data

(63) Continuation of application No. 09/992,076, filed on Nov. 13, 2001, now Pat. No. 7,526,422.

(51) Int. Cl.
*G06F 9/455* (2006.01)
(52) U.S. Cl. .......................................................... 703/28
(58) Field of Classification Search .................... 703/28; 714/28–30
See application file for complete search history.

(56) References Cited

U.S. PATENT DOCUMENTS

| | | | | |
|---|---|---|---|---|
| 5,065,312 A | * | 11/1991 | Bruckert et al. | 714/11 |
| 5,371,878 A | * | 12/1994 | Coker | 703/28 |
| 5,442,772 A | * | 8/1995 | Childs et al. | 703/13 |
| 6,173,419 B1 | * | 1/2001 | Barnett | 714/28 |

OTHER PUBLICATIONS

Stan Augarten, "The Chip Collection—Introduction—Smithsonian Institute", "State of the Art", "The First 256-Bit Static Ram", retrieved on Nov. 14, 2005 from http://smithsonianchips.si.edu/augartent/p24.htm.*

* cited by examiner

*Primary Examiner* — Paul Rodriguez
*Assistant Examiner* — Bernard E Cothran

(57) ABSTRACT

A system and a method for checking consistency of a lock-step process while debugging a microcontroller code. The virtual microcontroller and the microcontroller simultaneously and independently run a microcontroller code. The microcontroller includes a first memory and the virtual microcontroller residing in the ICE includes a second memory. A host computer copies a content of the first memory and a content of the second memory in the host computer memory when the execution of the code is halted. The host device compares the content of the first memory and the content of the second memory for consistency. In case of a disparity between the content of the first memory and the content of the second memory, a user traces the execution of the code in a trace buffer residing in the ICE and debugs the faulty code accordingly.

20 Claims, 3 Drawing Sheets

SYSTEM AND A METHOD FOR CHECKING LOCK-STEP CONSISTENCY BETWEEN AN IN CIRCUIT EMULATION AND A MICROCONTROLLER

RELATED APPLICATIONS

This application is a Continuation and claims the benefit and priority to U.S. Patent Application with application Ser. No. 09/992,076, filed on Nov. 13, 2001, now U.S. Pat. No. 7,526,422 entitled "A SYSTEM AND METHOD FOR CHECKING LOCK-STEP CONSISTENCY BETWEEN AN IN CIRCUIT EMULATION AND A MICROCONTROLLER", by Nemecek and assigned to the same assignee, which is incorporated herein by reference in its entirety.

FIELD OF INVENTION

This invention relates generally to the field of in circuit emulation (ICE). More specifically, an embodiment of the present invention relates to a method and system for "lock-step" consistency checking between an ICE and a production microcontroller.

BACKGROUND OF THE INVENTION

In circuit emulation (ICE) has been used by software and hardware developers for a number of years as a development tool to emulate the operation of complex circuit building blocks and permit diagnosis and debugging of hardware and software. Such in circuit emulation is most commonly used to analyze and debug the behavior of complex devices such as microcontrollers and microprocessors that have internal structures that are far too complex to readily model using computer simulation software alone.

FIG. 1 illustrates an exemplary conventional in-circuit emulation arrangement 100 used to model, analyze and debug the operation of a microcontroller device. In this arrangement, a host computer (e.g., a personal computer) 110 is connected to a debug logic 120, which is further connected to a special version of the microcontroller device that has been developed specially for use in emulation. Traditionally, a microcontroller manufacturer would manufacture two versions of any one of its microcontrollers, a special version and a production version. The special version of the microcontroller includes specialized testing hardware (e.g., scan chains, registers, and the like) for supporting software debugging functions. The special version is only used for the purpose of testing and debugging microcontroller code, where the debugged microcontroller code is eventually loaded in the production version of the same microcontroller to be marketed.

A debugging operation starts with the host computer 110 loading instructions through debug logic block 120 to the special version of the microcontroller 130 where the instructions are executed. Depending upon the application, this operation may be monitored while the special version of the microcontroller 130 is interconnected with the circuitry that is intended to interface a production version of the microcontroller in the finished product under development. Such interconnection may be via simulation within the host computer 110 or as actual circuitry or some combination thereof. As the circuit is stepped through its operation, the debug logic gathers information about the state of various components of the microcontroller 130 during operation and feeds that information back to the host computer 110 for analysis.

During the course of the analysis, various trace information such as time stamps, register value, data memory content, etc., may be logged in the host computer 110 for analysis and debugging by the designer. Additionally, it is generally the case that various break points can be defined by the designer that cause the program to halt execution at various points in the operation to permit detailed analysis. Other debugging tools may also be provided to enable the user to debug the operation of the circuit.

Typically during the debugging process a designer would prefer to run the microcontroller in as much of a production world situation as possible. Therefore, a microcontroller is installed in a test circuit, which closely resembles the hardware that is to be controlled by the production version of the microcontroller under the test.

As described above, ICE is a conventional technique for debugging a microcontroller code. A typical ICE includes a production microcontroller used for debugging purposes, a virtual copy of the production microcontroller which exist in the base station unit and a host device. The production microcontroller comprises a memory, a CPU register, a SRAM, a program counter, and a file register. The host device copies a substantial part of the production microcontroller in the base station, which forms the virtual microcontroller. The base station comprises a memory, a CPU register, a SRAM, a program counter, and a file register.

Debugging process is initiated by software residing in the host device, which loads the microcontroller code in both production microcontroller and the virtual microcontroller. The Production microcontroller and the virtual microcontroller run the microcontroller code in a synchronized process. The Synchronization of the production microcontroller and the virtual microcontroller requires that the production microcontroller and the virtual microcontroller start running the microcontroller code at the same time, execute the same lines of code sequentially, and if there is a breakpoint in the code or if a user halts the execution for any purpose, both production and virtual microcontroller encounter the command at the same time. Furthermore, synchronization requires that during the course of debugging the microcontroller code, after execution of each line of the microcontroller code, the memory, the CPU register, and SRAM of the virtual microcontroller and the production microcontroller have the same value.

Therefore a need exists to ensure the integrity of the synchronized code execution when the debugging process if halted. Furthermore, a need exists to check the consistency of the synchronized execution process when the production microcontroller and the virtual microcontroller encounter a break point during the course of the execution of the microcontroller code. Also a need exist to ensure the memory contents of the production microcontroller and the ICE to mirror image one another. The present invention provides a novel solution to these requirements.

SUMMARY OF THE INVENTION

An embodiment of the present invention provides a user with capability to conduct a lock-step consistency check during a debugging process of a microcontroller code. One embodiment of the present invention provides a host device to read in a content of a memory in an ICE and a content of a memory in a production microcontroller into a memory residing in the host device. Another embodiment of the present invention provides software, residing in the host computer, to perform a consistency check and to verify the integrity of a lock-step process by comparing the contents of the memory in the ICE against the content of the memory in the production microcontroller when execution of the microcontroller code is halted. If the result of the comparison is a mismatch, the software residing in the host device issues a signal indicating a "lock-step error".

Another embodiment of the present invention provides a consistency check when a breakpoint is encountered. According to the lock-step process of this embodiment, the production microcontroller and the virtual microcontroller run the same microcontroller code step by step and in synchronization, therefore, both microcontrollers should be executing the same line of code even if the line of code is a breakpoint. Accordingly, the lock-step process accesses the content of SRAM in the production microcontroller and the content of SRAM in the ICE to verify they have the same value and are mirror images of one another.

Another embodiment of the present invention provides a method for debugging a microcontroller code comprising the steps of initializing a first memory of an ICE (in circuit emulator) and a second memory of a production microcontroller and running the microcontroller code on the production microcontroller and the ICE simultaneously. A trace buffer residing in the ICE is used to locate the failed code of the microcontroller code. The content of the first memory and a content of the second memory are compared for consistency.

Another embodiment provides a system for checking consistency of a lock-step process while debugging a microcontroller codes. A host device contains a partial copy of a production microcontroller in an ICE to form a virtual microcontroller. The virtual microcontroller and a production microcontroller simultaneously and independently run a microcontroller code for debugging purposes. The production microcontroller resides on a test circuit and includes a first memory, and the virtual microcontroller resides in the ICE includes a second memory. A host computer copies a content of the first memory and a content of the second memory into the host computer memory when the execution of the microcontroller code is halted. Software in the host computer compares the content of the first memory and the content of the second memory for consistency. In case of a disparity between the content of the first memory and the content of the second memory, a user traces the execution of the code in a trace buffer residing in the ICE and debugs a faulty microcontroller code accordingly.

These and other objects and advantages of the present invention will become obvious to those of ordinary skill in the art after having read the following detailed description of the preferred embodiment which are illustrated in the various drawing figures.

BRIEF DESCRIPTION OF THE DRAWINGS

The feature of the invention believed to be novel are set forth with particularity in the appended claims. The invention itself however, both as to organization and method of operation, together with objects and advantages thereof, may be best understood be reference to the following detailed description of the invention, which describes certain exemplary embodiments of the invention, taken in conjunction with the accompanying drawings in which:

Figure 1:
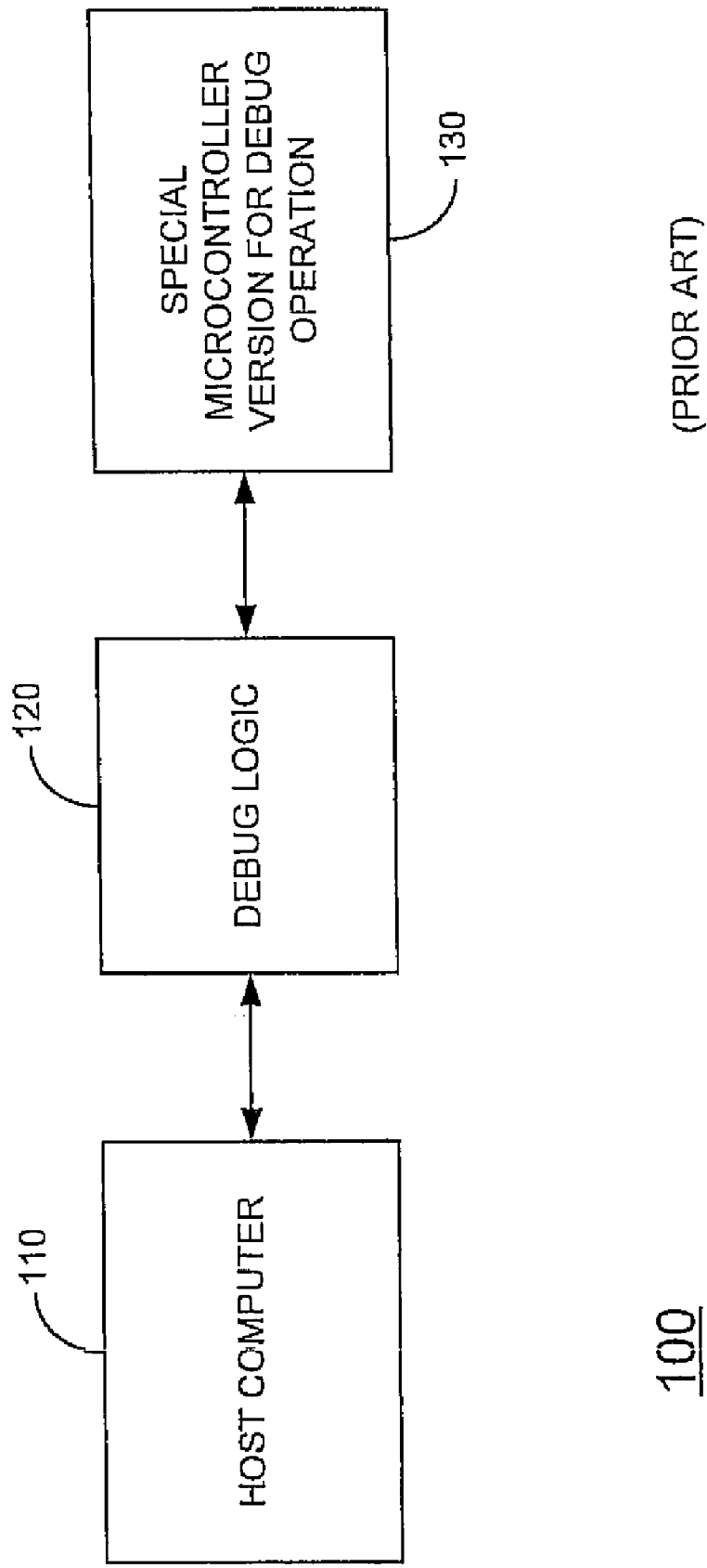
FIG. 1 (Prior Art) is a block diagram of a conventional in circuit emulator (ICE).

The accompanying drawings, which are incorporated in and form a part of this specification, illustrate embodiment of the invention and, together with the description, serve to explain the principles of the invention.

DETAILED DESCRIPTION OF THE PREFERRED EMBODIMENTS

Reference will now be made in detail to preferred embodiment of the invention, a system and a method for checking lock-step consistency between an ICE and a microcontroller, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specified details are set forth in order to provide a thorough understanding of the present invention. However, it will be obvious to one of ordinary skill in the art that the present invention may be practiced without these specific details. In other instances, well known methods, and circuits have not been described in detail as not to unnecessarily obscure aspects of the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have been described in detail as not necessarily obscure aspects of the present invention.

Notation And Nomenclature:

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey executed steps, logic block, process etc., is here, and generally, convinced to be self consistent sequence of steps or instructions leading to a desired result. The steps are those requiring physical manipulations of physical quantities.

Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be born in mind, however, that all of these and similar terms are to be those associated with the appropriate physical quantities and are merely convenient labels applied to those quantities. Unless specifically stated otherwise as apparent from the following discussions, it is appreciated that throughout the present invention, discussion utilizing terms such as "processing" or "transferring" or "executing" or "determining" or "instructing" or "issuing" or "halting" or the like, refer to the action and processes of a computer system, or similar electronic computing device, that manipulates and transforms data represented as physical (electronic)

quantities within the computer system's registers and memories into other data similarly represented as physical quantities within the computer system memories or registers or other such information storage, transmission or display devices.

Method and System of the Invention:

While this invention is susceptible of embodiment in many different forms, there is shown in the drawings and will herein be described in detail specific embodiment, with the understanding that the present disclosure is to be considered as an example of the principles of the invention and not intended to limit the invention to the specific embodiment shown and described. In the description below, like reference numerals are used to describe the same, similar or corresponding parts in the several views of the drawings.

A commercial ICE system utilizing the present invention is available from Cypress Micro Systems, Inc., for the CY8C25xxxJ26xxx series of microcontrollers. Detailed information regarding this commercial product is available from Cypress Micro Systems, inc., 22027 17$^{th}$ Avenue SE, Suite 201 Bothell, Wash. 98021 Bothell, Wash. in the form of version 1.11 of "PsoC Designer: Integrated Development Environment User Guide", which is hereby incorporated by reference. While the present invention is described in terms of an ICE system for the above exemplary microcontroller device, the invention is equally applicable to other complex circuitry including microprocessor and other circuitry that is suitable for analysis and debugging using in-circuit emulation. Moreover, the invention is not limited to the exact implementation details of the exemplary embodiment used herein for illustrative purposes.

Figure 2:
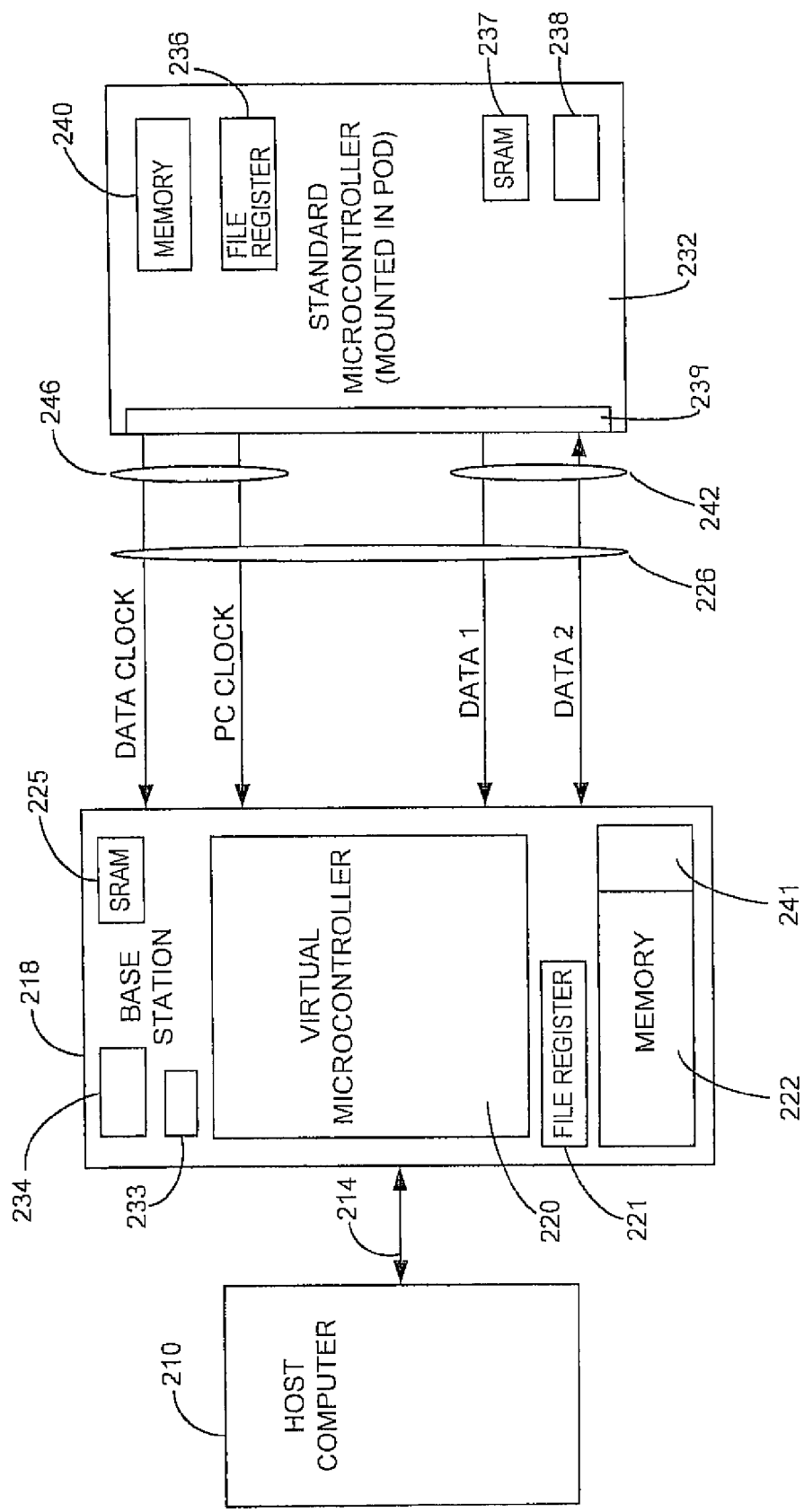
FIG. 2 is a block diagram of an exemplary in circuit emulation system consistent with certain microcontroller embodiments of the present invention.

Referring now to FIG. 2, an architecture for implementation of an embodiment of an ICE system of the present invention is illustrated as system 200. In system 200, a host computer 210 (e.g., a personal computer based on a Pentium™ class microprocessor) is interconnected (e.g., using a production PC interface 214 such as a parallel printer port connection, a universal serial port (USB) connection, etc.) with a base station 218. The host computer 210 generally operates to run an ICE computer program to control the emulation process and further operates in the capacity of a logic analyzer to permit a user to view information provided from the base station 218 for use in analyzing and debugging a device under test or development. According to an embodiment of the present invention microcontroller 232, mounted on a pod, comprises of file register 236, SRAM 237, CPU 238, memory 240, and a program counter 239.

The base station 218 is based upon a general purpose programmable hardware device such as a gate array configured to function as a functionally equivalent "virtual microcontroller" 220. This is accomplished using an associated integral memory 222 which stores program instructions, data, and other associated information. Base station 218 comprises of file register 221, SRAM 225, CPU 234 and program counter 233. The base station 218 is configured as an emulator of the internal microprocessor portion of the microcontroller 232. In preferred embodiments, a field programmable gate array FPGA (or other programmable logic device) is configured to function as the virtual microcontroller 220. The FPGA and virtual microcontroller 220 will be referred to interchangeably herein. The base station 218 further includes a trace buffer 241, which stores trace path of the code. The pod, in certain embodiments, provides connection to the microcontroller 232 that permits external probing as well as interconnection with other circuitry as might be used to simulate a system under development. Microcontroller 232 further comprises memory 240, SRAM 233, and CPU 234.

The FPGA of the base station 218 of the current embodiment is designed to emulate the core processor functionality (microprocessor functions, Arithmetic Logic Unit function, RAM, and ROM memory functions) of the Cypress CY8C25xxxl26xxx series microcontrollers. The CY8C25xxx/26xxx series of microcontroller also incorporate limited I/O functions and an interrupt controller as well as programmable digital and analog circuitry. This circuitry need not be modeled using the FPGA 220. Instead the I/O read information, interrupt vector and other information can be passed to the FPGA 220 from the microprocessor 232 via interface 226 as will be described later.

The base station 218's virtual microcontroller 220 operates to execute the code programmed into production microcontroller 232 in lock-step operation with production microcontroller 232. Thus, the actual microprocessor 232 is freed of any need to provide significant special facilities for ICE, since any such facilities can be provided in the virtual microcontroller 220. The base station 218's virtual microcontroller and microcontroller 232 execute all steps of the program under test and in lock-step without a need to communicate except when a break point or a halt state is encountered. The combination of production and virtual microcontroller behaves just as the microcontroller 232 would alone under normal operation conditions. I/O reads and interrupts vectors are transferred from the microcontroller 232 to the base station 218. Base station 218 is then able to provide the host computer 210 with the I/O reads and interrupts vectors as well as an array of information internal to the microcontroller 232 within memory and register locations that are otherwise inaccessible In the designing of a microcontroller other complex circuit such as the microcontroller 232, it is common to implement the design using the Verilog™ language (or other suitable language). Thus, it is common that the full functional design description of the microcontroller is fully available in a software format. The base station 218 of the current embodiment is based upon the commercially available Spartan™ series FPGAs from Xilinx, inc., 2100 Logic Drive, San Jose, Calif. 95124. The Verilog™ description can be used as the input to the FPGA design and synthesis tool available from the FPGA manufacturer to realize the virtual microcontroller 220 (generally after timing adjustments and other debugging). Thus, design and realization of the FPGA implementation of an emulator for the microcontroller (virtual microcontroller) or other device can be achieved by use of Verilog description along with circuitry to provide interfacing to the base station and the device under test (DUT).

In the embodiment described in connection with FIG. 2, the actual production microcontroller 232 carries out its normal functions in the intended application and passes I/O information and other information needed for debugging to the base station 218 only at a break point or when in halt state. The virtual microcontroller 220 implemented within the FPGA of base station 218 serves to provide the operator with visibility into the core processor functions that are inaccessible in the production microcontroller 232. Thus, the FPGA 220, by virtue of operating in lock-step operation with the microprocessor 232 provides an exact duplicate of internal registers, memory contents, interrupt vectors and other useful debug information. Additionally, trace buffer 241 can be used to store information useful in trace operations that is gathered by the FPGA 220 during execution of the program under test. This architecture, therefore, permits the operator to have visibility into the inner working of the microcontroller 232 without need to provide special boundouts and expensive circuitry on the microcontroller itself.

The base station 218's FPGA based virtual microcontroller 220, operating under control of host computer 210, carries out the core processor function of microcontroller 232 and thus contains a functionally exact emulated copy of the contents of the registers and memory of the production microcontroller 232. The ICE system starts both microcontrollers (production and virtual) at the same time and keeps them running in synchronization. One embodiment of the present invention provides a consistency check whenever the system is halted (i.e., when the system is not emulating), or when the system encounters a breakpoint (e.g., sleep, stall, internal start/stop, stalls, etc.).

For example, whenever production microcontroller 232 and virtual microcontroller 220 are running a code the execution of the code is in lock-step. In other word, the two microcontrollers are running the same code, they start running the code at the same time, they hit the same break point, and they stop at the same line of code. To ensure the integrity of the debugging process in production microcontrollers 232 and virtual microcontroller 220, a consistency check is performed at any opportune time. It is appreciated that computer system 210 and the host device 210 are refereed to interchangeably herein.

For example a consistency check may be conducted when the execution of the debugging operation is halted. The consistency check comprises: comparing a content of SRAM 225 and a content of SEAM 237, and comparing a content of CPU registers 234 and a content of CPU registers 238. The software in host device 210 reads back the content of SRAM 225 and the content of SRAM 237 into memory 222. The software program residing in host device 210 compares the contents the two SRAMs to verify the consistency. If the contents of the two SRAMs are not consistent the software in the host device 210 issues a signal indicating a "lock-step error" Similarly, the software in the host device 210 may compare a content of ICE CPU register 238 and a content of production microcontroller CPU register 234, for consistency verification. In a similar manner the software in host device 210 reads back a content of CPU 238 and a content of CPU 234 into memory 222. The software program residing in host device 210 compares the contents the two CPU and signals "lock-step error" if the contents of the two CPUs are not matching.

When a lock-step signal is detected, the user checks the trace buffers 241. The trace buffer 241, residing in the base station 218, keeps track of each line of the code executed. Examining trace buffer 241 the user can determines which line of code caused the halt. Trace buffer 241 also keeps track of the content of CPU registers on each line of code. The user can back track the execution of each line of code and the associated CPU registers to find the exact line of code where the content of CPU register 238 and the content of CPU register 234 diverged as a result of a faulty code. Once the code is debugged the debugging process will resume. It is appreciated that CPU register 234 and SRAM 225 in base station 218 and CPU register 238 and SRAM 237 in production microcontroller 232 are initialized with zeros to ensure the integrity of the tracing and the consistency checking.

Similarly, when a break point is encountered, a lock-step consistency check may be conducted. The lock-step operation of the microcontroller 232 and the virtual microcontroller 220 requires the virtual microcontroller 220 and production microcontroller 232 to start running a microcontroller code at the same time, run each line of the microcontroller code at the same time, have the same CPU register content and the same SRAM content on both sides, and to stop at the exactly the same line of code when a breakpoint is encountered. Therefore, at a breakpoint the software in the host device 210 will conduct a consistency check as described above and if there is a mismatch of memory content or SRAM content the host device 210 will issue a "lock-step error".

In the embodiment illustrated, the basic interface used is a four line interface between microcontroller 232 and base station 218. This interface permits use of a production eight wires Category Five patch cable to connect the microcontroller 232 and base station 218 in one embodiment, but of course, this is not to be considered limiting. The four wire interface 226 of the present embodiment can be functionally divided into two functional portions. A data transport portion 242 carries two data lines in the current embodiment. A clock portion 246 carries a data clock plus the microcontroller clock signal for the microcontroller 232. Three additional lines are also provided (not shown) for supply, ground and reset line. But, the data transport portion 242 and the clock portion 246 are of primary interest, since the supply and reset functions can be readily provided in any other suitable manner.

The two portions of the interface are implemented in the current embodiment using four lines as described, however, in other embodiments, these two portions can be implemented with as few as two wires. In the current embodiment, the microcontroller clock signal can be varied by programming (even dynamically during execution of a program). Therefore, it is desirable to have two clock signals-microcontroller clock to easily track the microcontroller clock timing as well a system clock that regulates the data transfer and other operations. However, in other embodiments, particularly where a clock frequency is not changed dynamically, a single clock can be used. The single clock can be multiplied or divided as required to implement the required clocking signal.

The present embodiment uses an eight bit microcontroller that only reads eight bits at a time on any given I/O read. Thus, the present microcontroller 232 needs only to effect serializing and transferring a maximum of one eight bit I/O read for each instruction cycle. This is easily accommodated using two data lines transferring four bits each over four system clock cycles. However, using a clock, which is two times faster, a single line could equally well transfer the data in the same time. Similarly, four lines could be used to transfer the same data in a short enough time to permit the virtual microcontroller 220 to process the data and issue any needed response before the next instruction cycle begins. The time required to accomplish this is held at a minimum in the current invention, since the system synchronization eliminates need for any overhead protocol for transmission of the data.

The present embodiment uses a four line communication interface and method of communication between the FPGA within base station 218 (acting as a "virtual microcontroller" 220 or ICE) and the production microcontroller device under test (microcontroller 232). The four line communication interface is time-dependent so that different information can be transferred at different times over a small number of communication lines. Moreover, since the two processors operate in lock-step, there is no need to provide bus arbitration, framing, or other protocol overhead to effect the communication between the microcontroller 232 and the virtual microcontroller 220. This interface is used for, among other things, transferring of I/O data from the microcontroller 232 to the FPGA 220 (since FPGA emulates only the core processor functions of the microcontroller in the current embodiment). A first interface line (data1) is a data line used by the microcontroller 232 to send I/O data to FPGA based virtual microcontroller 220. This line is also used to notify the FPGA 220 of pending interrupts. This data1 line is only driven by the production microcontroller 232. A second data line (Data2), which is bi-directional, is used by the microcontroller 232 to send I/O data to FPGA based virtual microcontroller of base station 218. In addition, the FPGA 220 uses the Data2 line to convey halt requests (i.e., to implement simple or complex breakpoints) to the microcontroller 232.

A third interface line is a 24/48 Mhz data clock used to drive the virtual microcontroller 220's communication state machines (the logic used within the state controller to communicate with the microcontroller 232). In the current embodiment, this clock always runs at 24 Mhz unless the microcontroller 232's internal clock is running at 24 Mhz. In this case the system clock switches to 48 Mhz. Of course, these exact clock speeds are not to be considered limiting, but are presented as illustrative of the current exemplary embodiment. The fourth interface line is the internal microcontroller clock from the microcontroller 232.

A fifth line can be used to provide a system reset signal to effect the simultaneous startup of both microcontrollers. This fifth line provides a convenient mechanism to reset the microcontrollers, but in most environments, the simultaneous startup can also be effected in other ways including switching of power. Sixth and seventh lines are provided in the current interface to provide power and ground for power supply.

The base station 218's virtual microcontroller 220 communicates with the microcontroller 232 via four signal and clock lines forming a part of the four line interface 226 forming a part of a seven wire connection as described below. The interface signals travel over a short (e.g., one foot) of CAT 5 network cable. The ICE transmits break commands to the microcontroller 232 via the base station 218, along with register read/write command when the microcontroller 232 is halted. The microcontroller 232 uses the interface to return register information when halted, and to send I/O read, interrupt, vector, and watchdog information while running. The microcontroller 232 also sends a copy of its internal clocks for the ICE.

Synchronization between the microcontroller 232 and the virtual microcontroller 220 is achieved by virtue of their virtually identical operation. They are both started simultaneously by a power on or reset signal. They then track each other's operation continuously executing the same instructions using the same clocking signals. The system clock signal and the microcontroller clock signal are shared between the two microcontrollers (production and virtual) so that even if the microprocessor clock is changed during operation, they remain in lock-step.

In accordance with certain embodiment of the invention, a mechanism is provided for allowing the FPGA 220 of base station 218 and the microcontroller 232 to stop at the same instruction in response to a break-point event (a break or halt). The FPGA 220 has the ability to monitor the microcontroller states of microcontroller 232 for a breakpoint event, due to its lock-step operation with microcontroller 232. In the process of executing an instruction, an internal start of instruction cycle (SOI) signal is generated (by both microcontrollers) that indicates that the device is about to execute a next instruction. If a break point signal (a halt or break signal—the term "halt" and "break" are used synonymously herein) is generated by the FPGA, the execution of the microcontroller 232 can be stopped at the SOI signal point before the next instruction starts.

Figure 3:
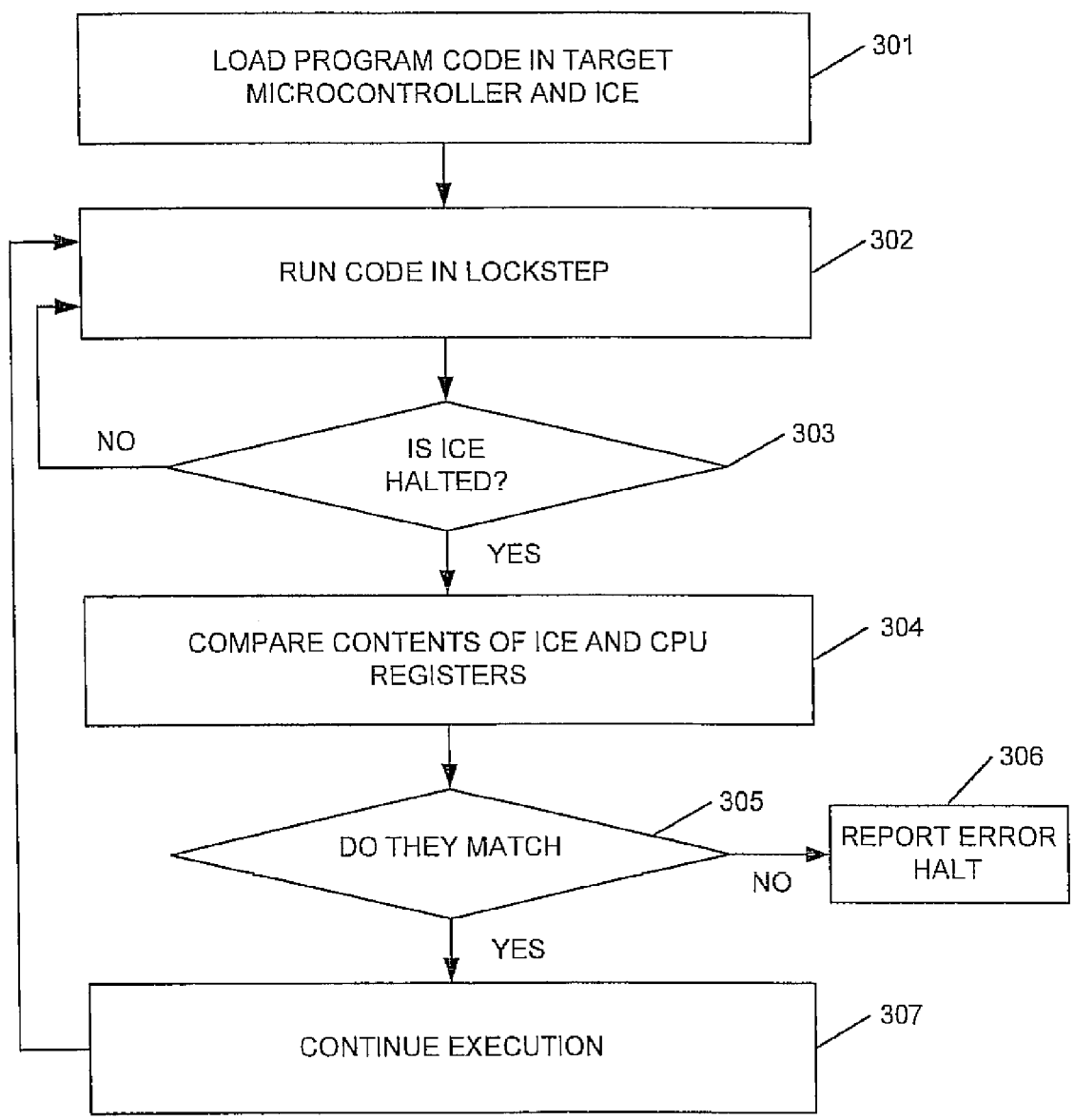
FIG. 3 is an illustration of checking the consistency of lock-step execution of a debugging process at a halt state.

FIG. 3 is a flow chart of the steps of a microcontroller code debugging process 300 in accordance with one embodiment of the present invention. As depicted in FIG. 3, process 300 shows the steps involved in debugging microcontroller code using a lock step execution ICE system (e.g., system 200 of FIG. 2).

Process 300 begins in step 301 where microcontroller program code is loaded into a target microcontroller and an ICE. As described above, the debugging process begins by initializing a first memory of the ICE and a second memory of the microcontroller with microcontroller test code. This test code typically comprises a microcontroller application requiring testing with multiple microcontroller configurations, settings, conditions, and the like. In step 302, code execution subsequently begins with the code being executed on both the microcontroller (e.g., the target microcontroller) and the ICE in lock step.

In step 303, process 300 determines whether the ICE is halted. A halt can occur due to, for example, a break point being encountered in the code. If the ICE is halted, process 300 proceeds to step 304. If no halt is encountered, process 300 proceeds back to step 302 where lock step execution continues.

In steps 304 and 305 lock step execution of the microcontroller code is checked and verified. In step 304 the content of the memories (RAM, SRAM, CPU registers, etc.) of the ICE and the microcontroller are compared. If the contents match, lock step execution is verified and process 300 proceeds to step 307 where execution continues. If the contents do not match, process 300 proceeds to step 306 where an error is reported and execution is halted.

The foregoing descriptions of specific embodiments of the present invention have been presented for purpose of illustration and description. They are not intended to be exhaustive or to limit the invention to the precise form disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A system for debugging microcontroller code, the system comprising:
   a microcontroller installed on a test circuit, wherein the microcontroller comprises a first memory and a first CPU;
   an IGE-(in circuit emulator (ICE) comprising a second memory and a second CPU coupled to a computer system, the ICE to emulate the microcontroller, the microcontroller and the ICE configured to run each of the microcontroller code in lock step; and
   an interface to couple the test circuit and the ICE to enable enabling data transmission between the test circuit and the computer system, the computer system configured to compare a content of the first memory in the microcontroller against a content of the second memory in the ICE to verify said lock step.

2. The system as recited in claim 1 wherein the microcontroller is installed on a POD.

3. The system as recited in claim 1 wherein the microcontroller is substantially copied in a field programmable gate array (FPGA) of the ICE.

4. The system as recited in claim 1 wherein the first memory a first Static Random Access Memory (SRAM) and the second memory a second SRAM.

5. The system as recited in claim 1 wherein the first memory further comprises a first plurality of register files and the second memory further comprises a second plurality of register files.

6. The system as recited in claim 1 wherein the first CPU comprises a first program counter and the second CPU comprises a second program counter,
and wherein lock step execution is maintained by maintaining the first program counter and the second program counter in lock step.

7. The system as recited in claim 1 wherein a user compares a content of the first memory and the content of a second memory for consistency when execution of the microcontroller code is halted.

8. The system as recited in claim 1 wherein a user compares a content of the first CPU and a content of the second CPU for consistency when execution of the microcontroller code is halted.

9. A method for debugging microcontroller code, the method comprising:
a) initializing a first memory of an in circuit emulator (ICE) and a second memory of a microcontroller with microcontroller test code;
b) executing each of the microcontroller test code on the microcontroller and on the ICE in lock step;
c) verifying lock step execution by comparing content of the first memory and content of the second memory;
d) if lock step execution is not verified, reporting an error and saving an execution history using a trace buffer coupled to the ICE; and
e) if lock step execution is verified, continuing execution of the microcontroller test code.

10. The method of claim 9 further comprising:
locating an error within the microcontroller test code by tracing the execution history using the trace buffer.

11. The method of claim 9 further comprising:
verifying lock step execution by comparing register contents of the first memory and register contents of the second memory.

12. The method of claim 9 wherein the ICE is implemented using a field programmable gate array (FPGA).

13. The method of claim 9 wherein the microcontroller is a production microcontroller.

14. The method of claim 9 further comprising:
halting the execution of the microcontroller test code when a breakpoint is encountered; and
verifying lock step execution by comparing content of the first memory and content of the second memory while the execution is halted.

15. A system for maintaining lock step execution of microcontroller test code during a debugging operation, the system comprising:
a microcontroller installed on a test circuit, wherein the microcontroller comprises a first memory;
an in circuit emulator (ICE) comprising a second memory, the ICE to emulate the microcontroller, the microcontroller and the ICE configured to run the microcontroller, the microcontroller and the ICE configured to run each of the microcontroller code in lock step;
a computer system coupled to the ICE to control a debugging operation on the microcontroller code; and
an interface to couple the test circuit and the ICE for data transmission, the computer system configured to access the ICE and access the test circuit to compare a content of the first memory against a content of the second memory to verify a lock step execution of the microcontroller code during the debugging operation.

16. The system as recited in claim 15 wherein the microcontroller is installed on a POD.

17. The system as recited in claim 15 wherein the microcontroller is substantially copied in a field programmable gate array (FPGA) of the ICE.

18. The system as recited in claim 15 wherein the first memory further comprising a first plurality of register files and the second memory further comprising a second plurality of register files.

19. The system as recited in claim 15 wherein a user compares the content of the first memory and the content of a second memory for consistency when execution of the microcontroller code is halted.

20. The system as recited in claim 15 wherein the microcontroller is a production microcontroller.

* * * * *